(12) United States Patent
Choi et al.

(10) Patent No.: US 11,586,261 B2
(45) Date of Patent: Feb. 21, 2023

(54) INFORMATION HANDLING SYSTEM THERMAL MANAGEMENT INTEGRATED WITH GLASS MATERIAL

(71) Applicant: Dell Products L.P., Round Rock, TX (US)

(72) Inventors: Duck-Soo Choi, Georgetown, TX (US); Peng Lip Goh, Singapore (SG); Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/372,759

(22) Filed: Jul. 12, 2021

(65) Prior Publication Data
US 2023/0012108 A1 Jan. 12, 2023

(51) Int. Cl.
*G06F 1/20* (2006.01)
*H05K 7/20* (2006.01)

(52) U.S. Cl.
CPC ........... *G06F 1/203* (2013.01); *H05K 7/2039* (2013.01)

(58) Field of Classification Search
CPC ............................. G06F 1/203; H05K 7/2039
See application file for complete search history.

(56) References Cited

U.S. PATENT DOCUMENTS

| | | | | |
|---|---|---|---|---|
| 7,486,517 B2 * | 2/2009 | Aapro | ................ | H05K 7/20436 361/705 |
| 2003/0066672 A1 * | 4/2003 | Watchko | ................... | C23C 4/00 174/50 |
| 2007/0263352 A1 * | 11/2007 | Jones | ................. | H05K 7/20418 361/688 |
| 2013/0141866 A1 * | 6/2013 | Refai-Ahmed | ..... | H01L 23/3672 361/679.54 |
| 2015/0253823 A1 * | 9/2015 | Han | ........................ | G06F 1/203 361/679.52 |
| 2016/0334843 A1 * | 11/2016 | Uto | ........................ | G06F 3/0443 |
| 2017/0315291 A1 * | 11/2017 | Nishita | ............. | G02F 1/133308 |

(Continued)

FOREIGN PATENT DOCUMENTS

| | | | | | |
|---|---|---|---|---|---|
| CN | | 103762424 A | * | 4/2014 | |
| WO | WO-2021035222 A2 | * | 2/2021 | ........... | A61F 7/0053 |

OTHER PUBLICATIONS

Kim et al. FPCB Electronic Device including FPCB structure, Feb. 17, 2021, Espacenet english translation (Year: 2021).*

(Continued)

*Primary Examiner* — Michael A Matey
(74) *Attorney, Agent, or Firm* — Zagorin Cave LLP; Robert W. Holland

(57) ABSTRACT

A portable information handling system glass ceramic housing integrates a heat sink of thermally conductive wire disposed in a coil or mesh pattern that is difficult to discern from the housing exterior. A thermal transfer device communicates thermal energy from internal processing components to the heat sink in aesthetically pleasing manner. For example, a plastic logo is coated with graphene to transfer thermal energy by pressing against the thermally conductive wire so that that logo is visible from the housing exterior. Through glass via opening provide air passages between the housing interior and exterior to promote rejection of the thermal energy from the housing.

20 Claims, 16 Drawing Sheets

(56) References Cited

U.S. PATENT DOCUMENTS

| | | | | |
|---|---|---|---|---|
| 2018/0046305 A1* | 2/2018 | Kang | .................... | G06F 3/0446 |
| 2018/0139867 A1* | 5/2018 | Muramatsu | ............ | G03B 17/02 |
| 2019/0196560 A1* | 6/2019 | Cha | ........................ | G06F 1/203 |
| 2020/0251122 A1* | 8/2020 | Huang | .................... | G06F 3/165 |
| 2022/0085843 A1* | 3/2022 | Bloom | .................... | G06F 1/163 |

OTHER PUBLICATIONS

Laptop Mag, "HP Envy 14 Spectre Hands-on: First Glass Ultrabook," downloaded from https://www.laptopmag.com/articles/hp-envy-14-spectre-hands-on-first-glass-ultrabook-coming-february-8th-for-1399 on Jul. 15, 2021, 11 pages.

Nokia, "5G Gaming," downloaded from https://www.nokia.com/networks/5g/gaming/ on Feb. 15, 2021, 5 pages.

Telia Company, "5G for Esports Tested," downloaded from https://www.teliacompany.com/en/news/news-articles/2018/5g-speeds-for-esports-tested/ on Jul. 15, 2021, 3 pages.

Corning, "Glass is Better for Wireless Charging," downloaded from https://www.corning.com/gorillaglass/worldwide/en/glass-is-better-for-wireless-charging.html on Jul. 15, 2021, 3 pages.

Nokia, "Smart Node Femtocells," downloaded from https://www.nokia.com/networks/solutions/femtocells/ on Jul. 15, 2021, 4 pages.

Researchgate, "60 GHz dipole antenna for short range indoor communication systems," downloaded from https://www.researchgate.net/publication/261233540_60_GHz_dipole_antenna_for_short_range_indoor_communication_systems on Jul. 15, 2021, 2 pages.

Lenovo, "Laptop Docking Stations," downloaded from https://www.lenovo.com/us/en/accessories-and-monitors/docking/dc/docking . . . on Jul. 15, 2021, 6 pages.

Cnet, "HP Advanced Wireless Docking Station—wireless docking station—VGA, 2 x DP—802.11ad (WiGig) Specs & Prices," downloaded from https://www.cnet.com/products/hp-advanced-wireless-docking-station-wireless-docking-station-vga-2-x-dp/ on Jul. 15, 2021, 6 pages.

PNAS, "High thermal conductivity in soft elastomers with elongated liquid metal inclusions," downloaded from https://www.pnas.org/content/114/9/2143 on Jul. 15, 2021, 27 pages.

Arieca, "Modem Materials for a Connected Society," downloaded from arieca.com, 7 pages.

Figshare, "Stretchable Graphene Thermistor with Tunable Thermal Index," downloaded from https://figshare.com/articles/journal_contribution/Stretchable_Graphene_Thermistor_with_Tunable_Thermal_Index/2193646 on Jul. 15, 2021, 7 pages.

Semantic Scholar, "Stretchable Graphene Thermistor with Tunable Thermal Index," downloaded from https://www.semanticscholar.org/paper/Stretchable-graphene-thermistor-with-tunable-index.-Yan-Wang/1d03bb564b4713a2b69a42f31a0ae6f1d5cf2bff on Jul. 15, 2021, 4 pages.

The Verge, The LG G8 has a vibrating OLED screen for a speaker, downloaded from https://www.theverge.com/2019/2/13/18224394/lg-g8-thinq-oled-speaker-quad-dac-boombox on Jul. 15, 2021, 2 pages.

* cited by examiner

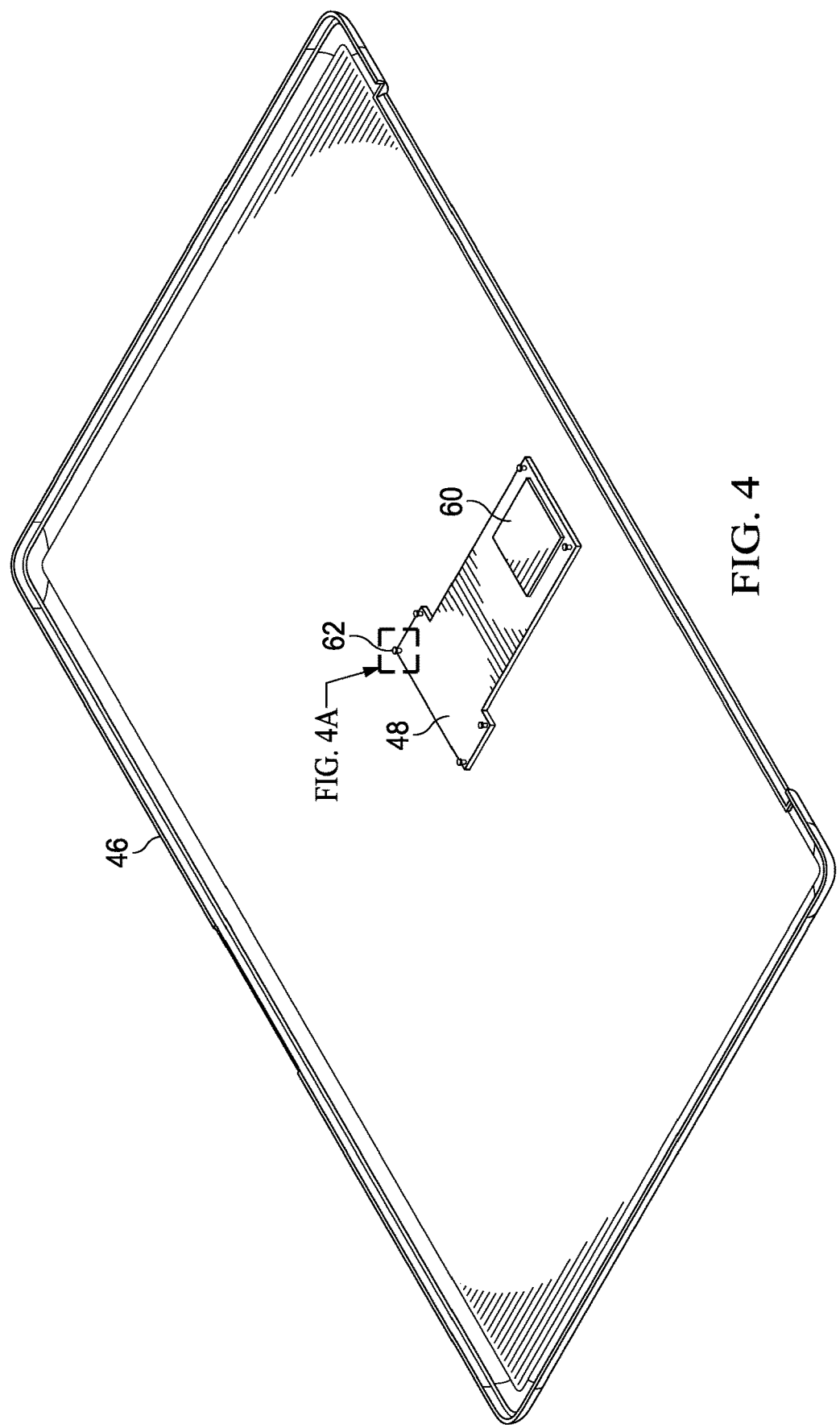

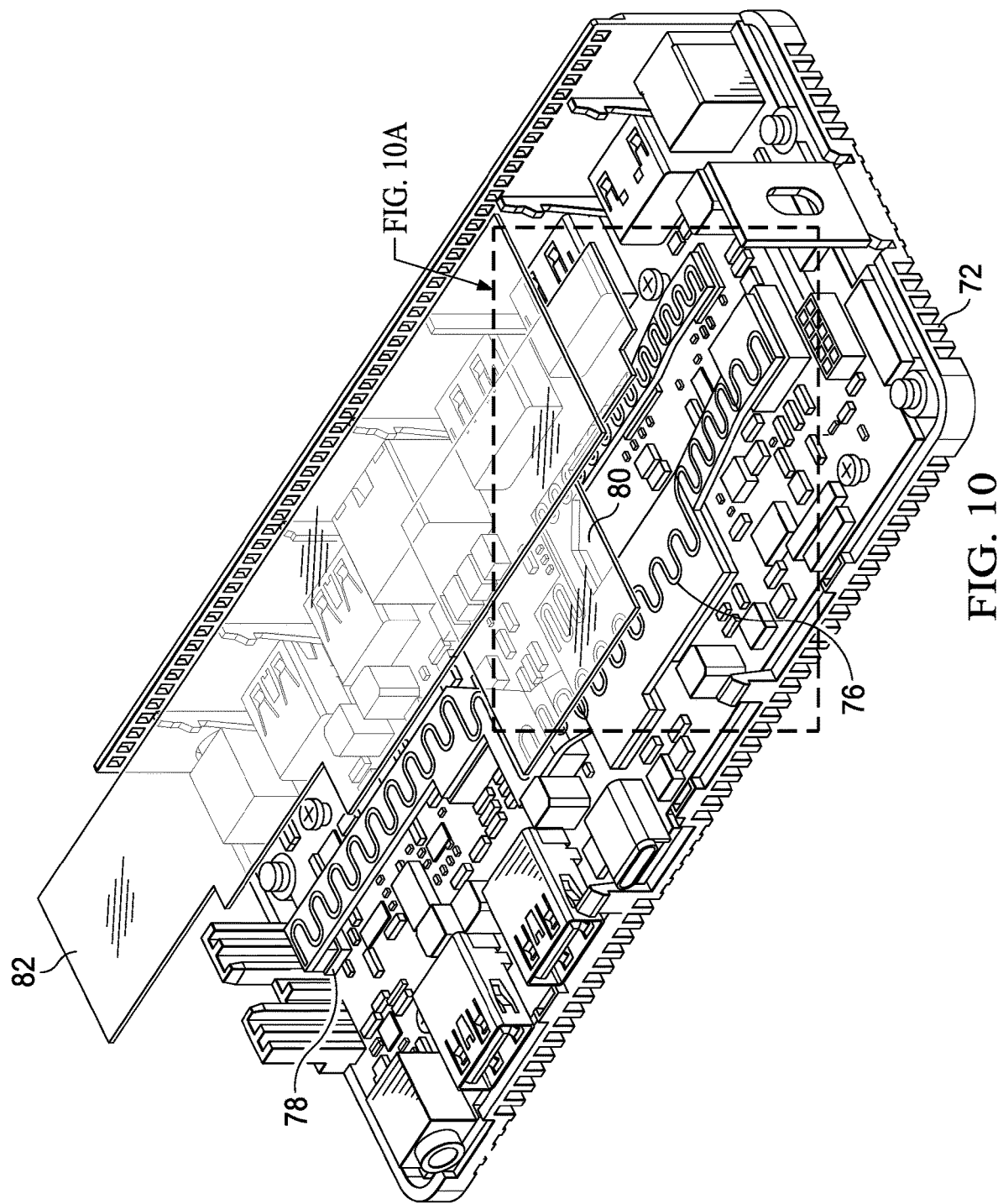

INFORMATION HANDLING SYSTEM THERMAL MANAGEMENT INTEGRATED WITH GLASS MATERIAL

BACKGROUND OF THE INVENTION

Field of the Invention

The present invention relates in general to the field of portable information handling systems, and more particularly to an information handling system thermal management integrated with glass material.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Generally, end users prefer portable information handling systems with a minimal footprint and weight, which has driven manufacturers to provide a given processing capability in as minimalist of a housing as possible. Typically, an end user selects a display size, which drives the housing width and length, and then selects a particular information handling that meets a desired performance level and housing thickness, also known as Z-height. Generally, as housing thickness decreases thermal constraints limit processing component performance due to less efficient rejection of excess thermal energy. Reduced housing thickness also increases the difficulty of including high performance components due to the reduced housing interior. For example, portable information handling systems often include a variety of wireless devices and antennae; where housing size is minimal, less room is available to deploy the antennae, which can increase wireless interference and hurt wireless signal transmission and reception. As another example, portable information handling systems are often used to present multimedia information, such as movies and music; where housing size is minimal, insufficient room exists to integrate a high quality speaker, particularly in lower audio tones that tend to need larger speaker volumes for high quality sound.

Another difficulty with low profile portable information handling systems is that thinner housings tend to be less robust and more susceptible to failure. Typically, portable housings are tested by repeated cycles of usage, such as repeated opening and closing of housing portions. To reduce housing thickness and weight, some manufacturers have moved towards more exotic materials, such as ceramics. One example of a material that offers aesthetically-pleasing and robust qualities is a glass ceramic material. Glass ceramic material has gained acceptance as a hardened clear cover placed over a display, especially in portable tablet and phone devices that are susceptible to dropping and breaking. One commercial product is Gorilla Glass by Corning, which provides a hardened transparent material that resists breakage. Glass ceramics offer advantages as a housing material in addition to use as a glass cover, although glass ceramics do not conduct or current heat very readily, which can introduce difficulties with thermal management, wireless signal management and other system functions.

SUMMARY OF THE INVENTION

Therefore, a need has arisen for a system and method which manages thermal energy of an information handling system housing or other processing device having a glass housing.

A further need exists for a system and method that dissipates thermal energy of processing components in a housing with efficient use of a housing footprint.

In accordance with the present invention, a system and method are provided which substantially reduce the disadvantages and problems associated with previous methods and systems for managing thermal energy of an information handling system or other processing devices. A glass housing integrates a thermally conductive material to provide a heat sink that interfaces with a processing component to dissipate excess thermal energy from the housing interior. In one embodiment, a heat sink of glass material pieces coated in graphene thermally interfaces with a processing component through a liquid metal embedded elastomer coupled to an elastic graphene to dissipate processing component excess thermal energy at the glass graphene coat.

More specifically, a portable information handling system processes information with processing components disposed in portable housing, such as a processor and memory. In one example embodiment, a main housing is formed from a planar glass ceramic piece and a plastic case coupled to the glass ceramic interior side. A heat sink coil integrates in the glass ceramic interior side interfaces through a heat conductor with a processing component, such as a central processing unit, to accept thermal energy from the processing component. In one example embodiment, the heat conductor is a logo that extends through the plastic case to contact the heat sink and transfer thermal energy while presenting the logo through the glass housing. Cooling channels formed between the glass ceramic interior and the plastic case provide cooling airflow to cool the heat sink and may interface with through glass via openings to exhaust heated air to the housing exterior. In another example embodiment, separate glass ceramic heat sink pieces coated with graphene may be disposed in the housing interior and interface with a processing component through a liquid metal embedded elastomer and elastic graphene to transfer thermal energy for dissipation at the glass ceramic heat sink graphene. The separate ceramic glass heat sink pieces may vertically stack in low profile housings to help dissipate excess thermal energy, such as in a docking station.

The present invention provides a number of important technical advantages. One example of an important technical advantage is that a glass ceramic housing integrates a heat sink in a low profile configuration with an aesthetically pleasing appearance. A logo presented at the glass housing includes thermally conductive material to transfer thermal energy from the housing interior to the integrated heat sink. Blending the heat sink as thin wire traces into the glass housing exposed at a logo location at the glass housing interior surface supports thermal transfer through an aesthetically pleasing logo heat conductor, such as a plastic logo coated with graphene. Through glass via openings interface with cooling channels formed along the glass housing interior side to aid in rejection of thermal energy through airflow of the cooling channels and through glass via openings. Separate heat sinks of graphene coated glass ceramic enhance passive thermal transfer with minimal Z-height by transferring thermal energy from a processing component with liquid metal embedded elastomer and elastic graphene.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 4, 4A and 4B depict an upper perspective view of an example of a heat conductor coupled to a plastic case to transfer thermal energy to an underlying heat sink integrated in a glass ceramic housing;

FIGS. 10 and 10A depict an exploded perspective view of the docking station and heat sink.

DETAILED DESCRIPTION

A portable information handling system housing of a glass ceramic material integrates a heat sink of thermally conductive material that thermally couples with a processing component at the housing interior surface. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
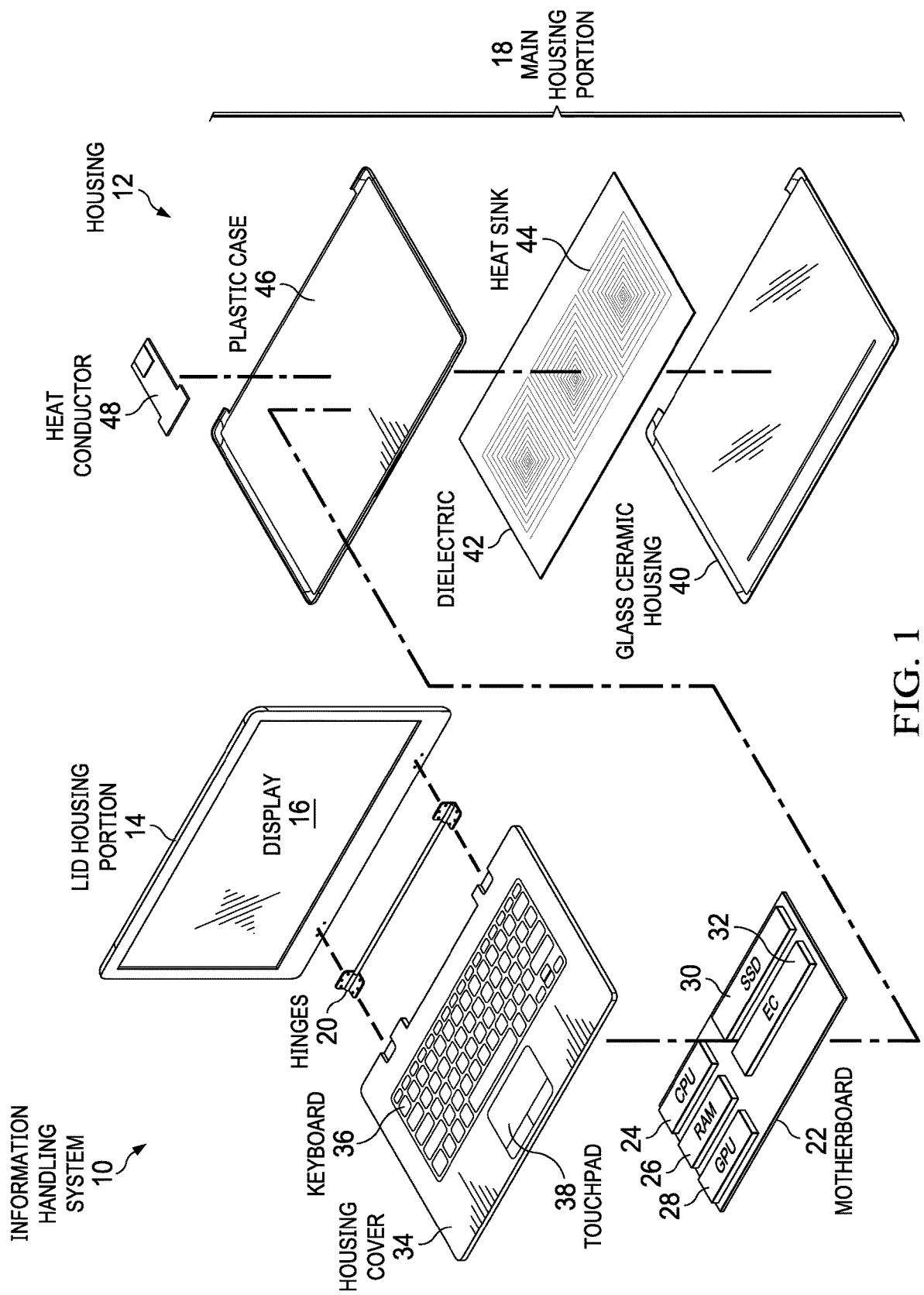
FIG. 1 depicts an exploded perspective view of a portable information handling system having a heat sink integrated in a glass ceramic housing.

Referring now to FIG. 1, an exploded perspective view depicts a portable information handling system 10 having a heat sink 44 integrated in a glass ceramic housing 12. In the example embodiment, information handling system 10 is built in a housing 12 having a main housing portion 18 rotationally coupled to a lid housing portion 14 by a hinge 20 to have a convertible configuration that translates between closed and open positions. Alternative embodiments may include tablet information handling systems having a planar housing or other types of housing arrangements. Main housing portion 18 houses processing components that cooperate to process information. For instance, a motherboard 22 coupled to main housing portion 18 interfaces a central processing unit (CPU) 24 that executes instructions to process information with a random access memory (RAM) 26 that stores the instructions and information. A graphics processing unit (GPU) 28 processes the information to generate pixel values that define a visual image for presentation at a display 16 integrated in lid housing portion 14. A solid state drive (SSD) 30 or other persistent storage device stores the information and instructions during power down periods, such as an operating system and applications that execute on CPU 24 to generate information. An embedded controller 32 interfaces with CPU 24 to manage system operations, such as power application and thermal constraints, and to coordinate interactions with input devices. A housing cover 34 couples over main housing portion 18 to support a keyboard 36 and touchpad 38 that accept end user inputs for communication with embedded controller 32. A display 16 integrates in lid housing portion 14 to present visual information as visual images, such as after graphics processing unit 28 further processes information of CPU 24 to define pixel values.

In the example embodiment, main housing portion 18 integrates a heat sink 44 that accepts excess thermal energy generated by processing components in the housing interior for dissipation and rejection to the housing exterior. A planar glass ceramic housing 40 is formed from a glass ceramic material, such as Gorilla glass by Corning. Glass ceramic material provides a hardened transparent glass with a polycrystalline structure produced by controlled crystallization of base glass to adapt properties of both glass and ceramic. In alternative embodiments, other housing materials may be used to include ceramic materials and glass materials more generally defined to include common glass. In the example embodiment, heat sink 44 integrates as a coil shape in a transparent dielectric 42 that couples to the interior side of glass ceramic housing 40 to hide the heat sink from view external to the system while dissipating excess thermal energy from the housing interior. In the example embodiment, heat sink 44 is a coil of silver alloy wire that is minimally visible to an exterior observer, although alternative embodiments may use other thermally conductive materials, such as graphene. As is described in greater depth below, through glass via (TGV) openings formed in glass ceramic housing 40 may communicate cooling airflow between the interior of the glass ceramic material and the housing exterior to aid in rejection of thermal energy to the housing exterior. A plastic case 46 having slits formed at a central location couples to the inner surface of glass ceramic housing 40 and provides through the slits access by a heat conductor 48 to contact against heat sink 44 at a central location. In the example embodiment, heat conductor 48 is a plastic piece coated with graphene and having a logo that fits through the slit openings of plastic case 46 to present the logo visibly at an exterior side of glass ceramic housing 40. The graphene coating at the logo communicates thermal energy to heat sink 44 from a processing component that thermally interfaces with an opposing end of heat conductor 48.

Figure 2:
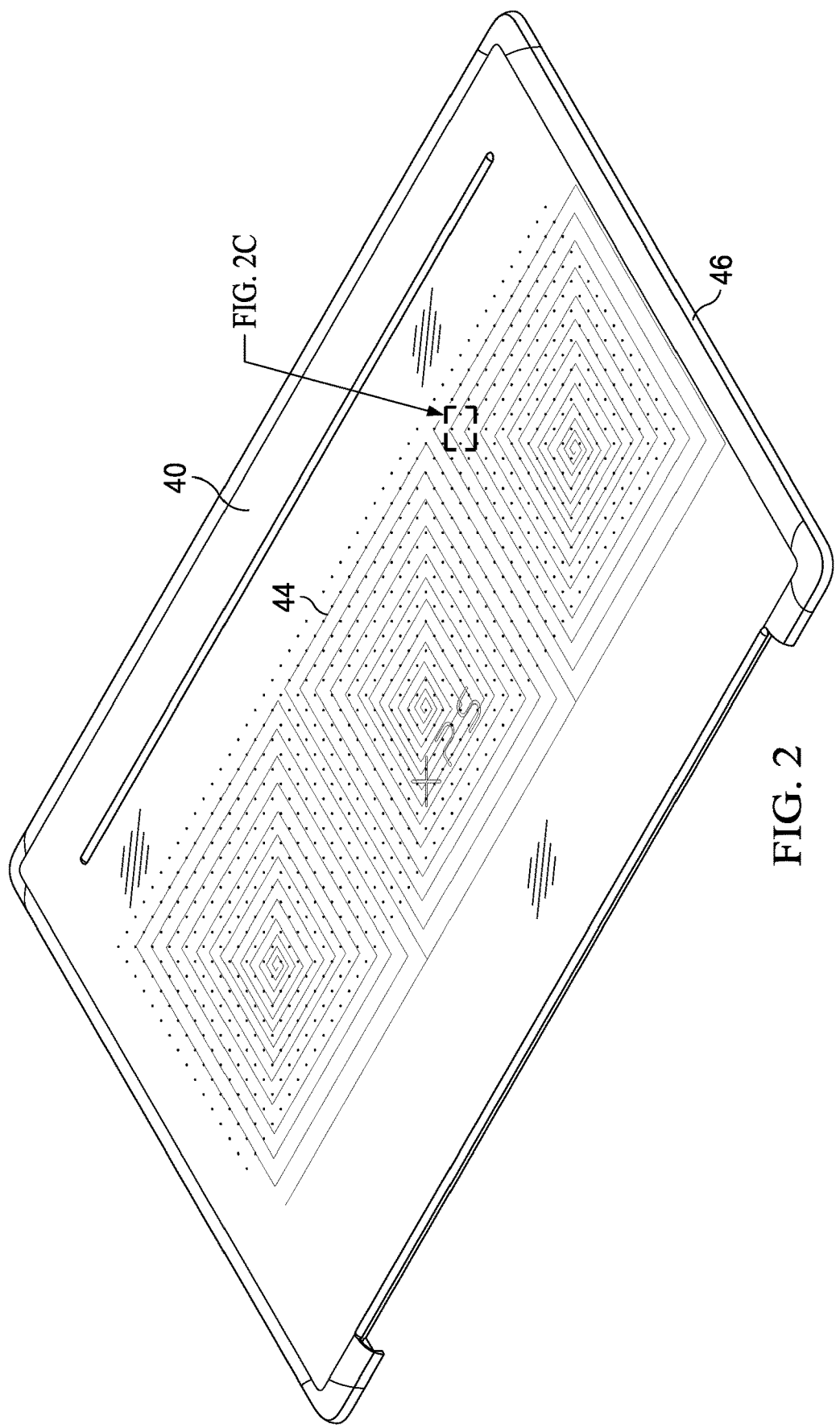
FIGS. 2, 2A, 2B and 2C depict a bottom view of main housing portion that illustrates one example of an integrated heat sink in an inner surface of a glass ceramic housing.
Figure 2A:
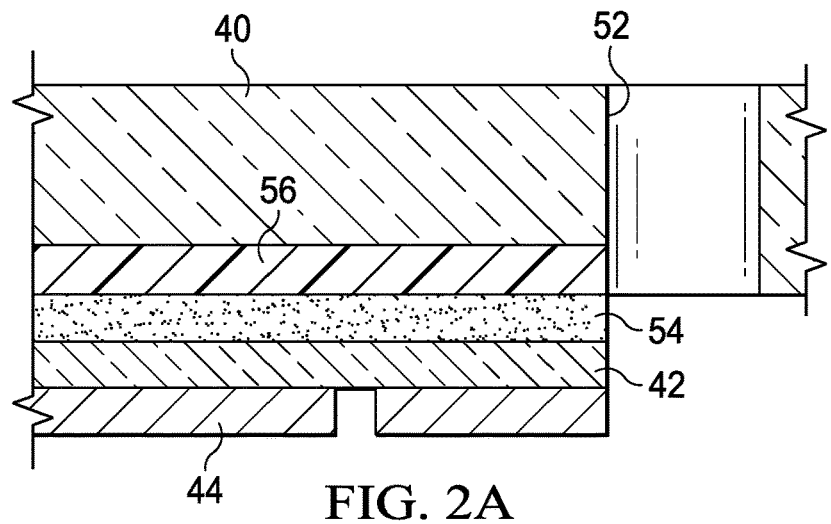
Figure 2B:
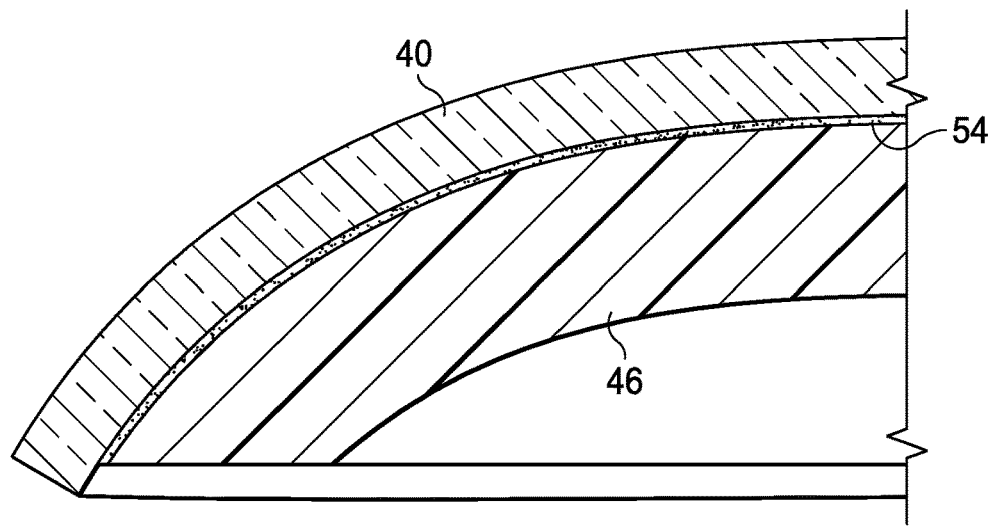
Figure 2C:
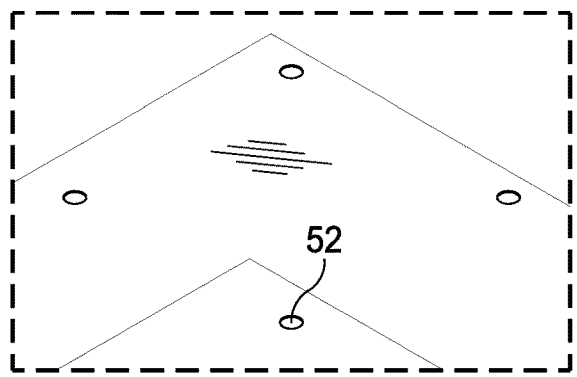

Referring now to FIGS. 2, 2A, 2B and 2C, a bottom view of main housing portion 18 illustrates one example of an integrated heat sink 44 in an inner surface of a glass ceramic housing 40. FIG. 2 depicts a bottom perspective view of main housing portion 18 having dielectric 42 with integrated heat sink 44 formed as three coils of a silver alloy wire coupled to it, such as with a liquid optically clear adhesive. Heat sink 44 has traces of silver alloy wire blended in with a silk screen coating and extending outward from and thermally interfaces with an XPS logo associated with the XPS product sold by DELL INC., as depicted in greater detail by FIGS. 3 and 4. FIG. 2A depicts a sectional side view of glass ceramic housing 40 with dielectric 42 integrating heat sink 44 as silver alloy wire traces to conduct and dissipate thermal energy. Dielectric 42 couples to glass ceramic housing 40 with an optically clear adhesive 54. In the example embodiment, a silk screen layer 56 or other opaque treatment disrupts viewing of wire traces that form heat sink 44 from external to glass ceramic housing 40. A through glass via opening 52 provides an airflow path from a cooling channel proximate heat sink 44 upwards to a location external main housing portion 18. In one example alternative embodiment, TGV opening 52 may have a thermally conductive material deposited, such as copper, that thermally interfaces with an outer dielectric and heat sink coupled to the exterior side of glass ceramic housing 40. Coupling a heat sink 44 to both the inner and outer sides of glass ceramic housing 40 increases the amount of thermal energy that can transfer out of the housing interior. FIG. 2B depicts a side sectional view glass ceramic housing 40 coupled to plastic case 46 with a liquid optically clear adhesive 54. In the example embodiment, the heat sink is disposed between the glass ceramic housing and plastic to accept thermal energy for dissipation to the housing exterior, such as with infrared illumination.

As an example, a silver alloy is used to form traces of the heat sink coil and integrates with the dielectric through a photolithography process. In photolithography, a silver alloy trace of 0.2 micrometers is first etched on a glass, which is then deposited on a 40 micrometer thick transparent dielectric to create a semi-invisible film. A 100 micrometer thick optically clear adhesive is applied to the glass ceramic and the silver alloy traces are interfaced to the conductive material of the logo by exposure at a central location or with a conductive material deposited in through glass via openings with a redistribution layer (RDL) process to provide a thermal interface with embedded silver alloy material. In one alternative embodiment, some or all of the wire traces may be etched or deposited directly to the glass ceramic material. In the example embodiment, the result is a set of three heat sink coils on an interior side of glass ceramic housing 40 that accept and dissipate thermal energy. In alternative embodiments, heat sink 44 may be defined with a mesh of interconnected squares or diagonals disposed across the interior side of the housing instead of the three coils depicted in the example embodiment. In one embodiment, the thermally conductive material may be selected to have a characteristic of irradiating energy out, such as with an infrared illumination generated with application of heat to the material.

Figure 3:
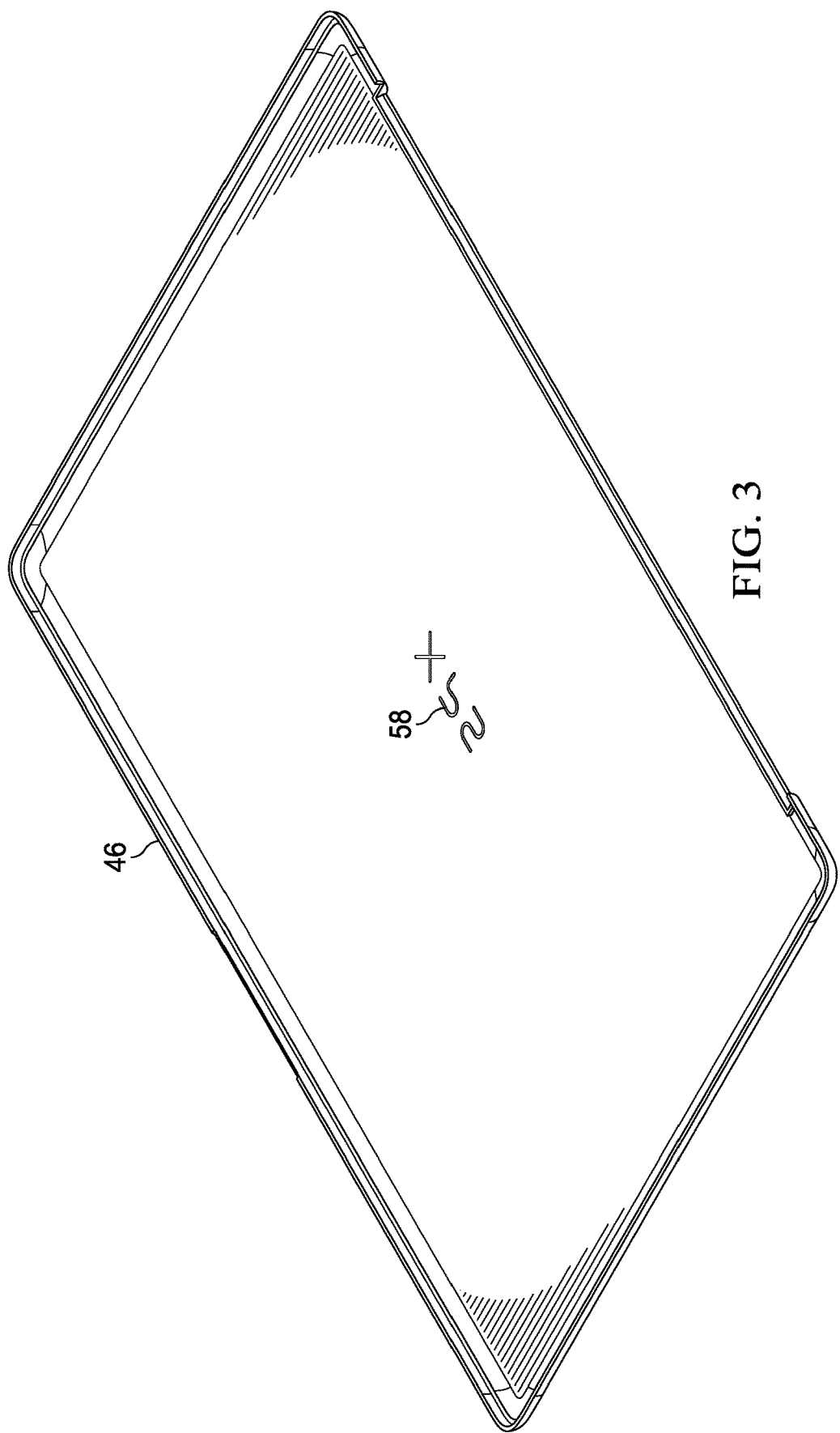
FIG. 3 depicts an upper perspective view of the glass ceramic housing as an example embodiment having a plastic case configured to have a thermal interface with a heat sink of an underlying glass ceramic housing through slit openings formed in the plastic case.

Referring now to FIG. 3, an upper perspective view of the glass ceramic housing 40 depicts an example embodiment having plastic case 46 configured to have a thermal interface with a heat sink of an underlying glass ceramic housing through slit openings 58 formed in the plastic case. In the example embodiment, the slit openings 58 match the shape of an XPS logo that accepts a heat conductor with an XPS logo exposed at one surface. As stated above, if an opaque treatment is applied before application of the heat sink dielectric to the glass ceramic housing, the heat sink may appear substantially invisible while the XPS logo is highlighted to provide a decorative appearance.

Figure 4A:
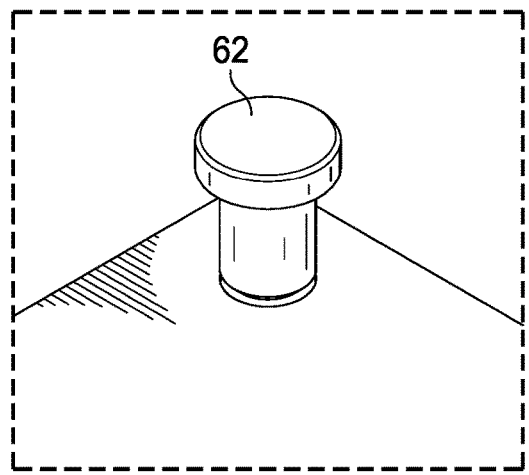
Figure 4B:
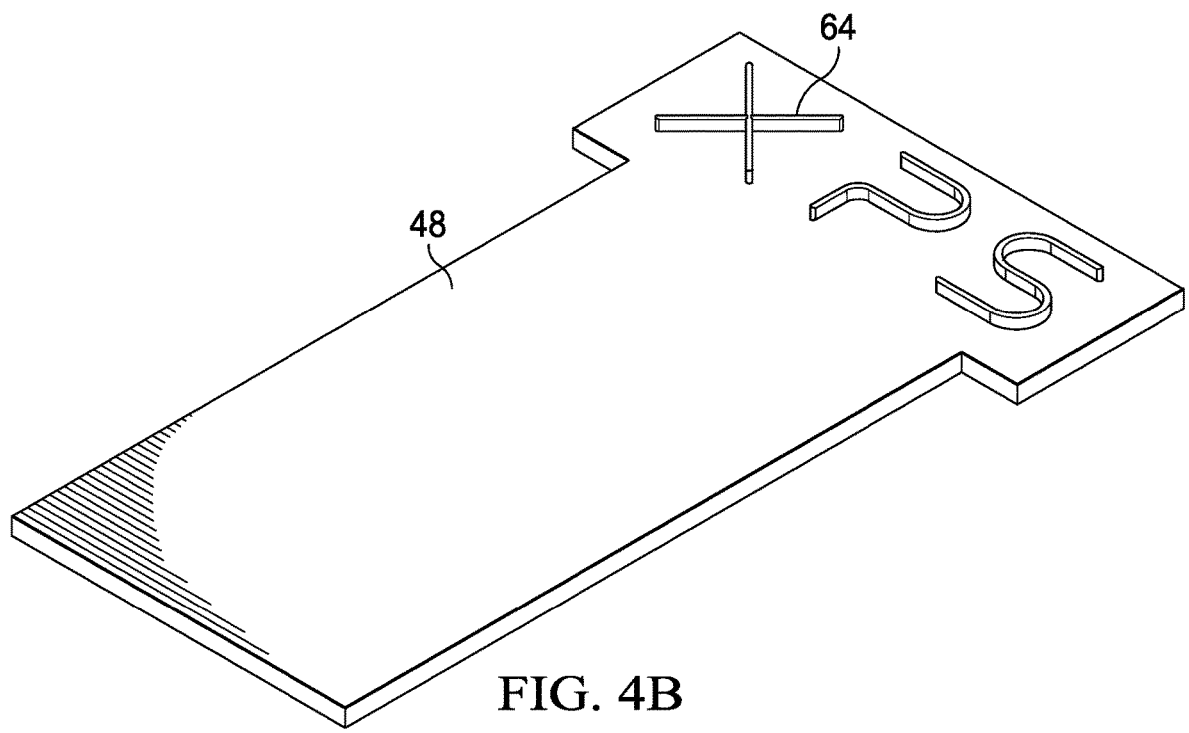

Referring now to FIGS. 4, 4A and 4B, an upper perspective view depicts an example of a heat conductor 48 coupled to a plastic case 46 to transfer thermal energy to an underlying heat sink integrated in a glass ceramic housing 40. In the example embodiment, heat conductor 48 is a plastic member having one end upper side treated with a thermal paste 60 to accept thermal energy, such as from a CPU, GPU or other processing component. The thermal energy is transferred through a thermally conductive coating applied to the plastic of heat conductor 48, such as a graphene coating. FIG. 4A illustrates that pogo pins 62 extending from heat conductor 48 provide a bias against plastic case 46 to help maintain a thermal interface with the underlying heat sink. FIG. 4B depicts a lower perspective view of heat conductor 48 to illustrate that logo letters 64 extend out from the bottom surface at the end opposite the processing component interface with letters and/or an image sized to match the slits formed in the plastic case. The XPS letters insert into the opening of plastic case 46 to press against the heat sink and transfer thermal energy from the processing component to the heat sink integrated with the glass ceramic housing.

Figure 5:
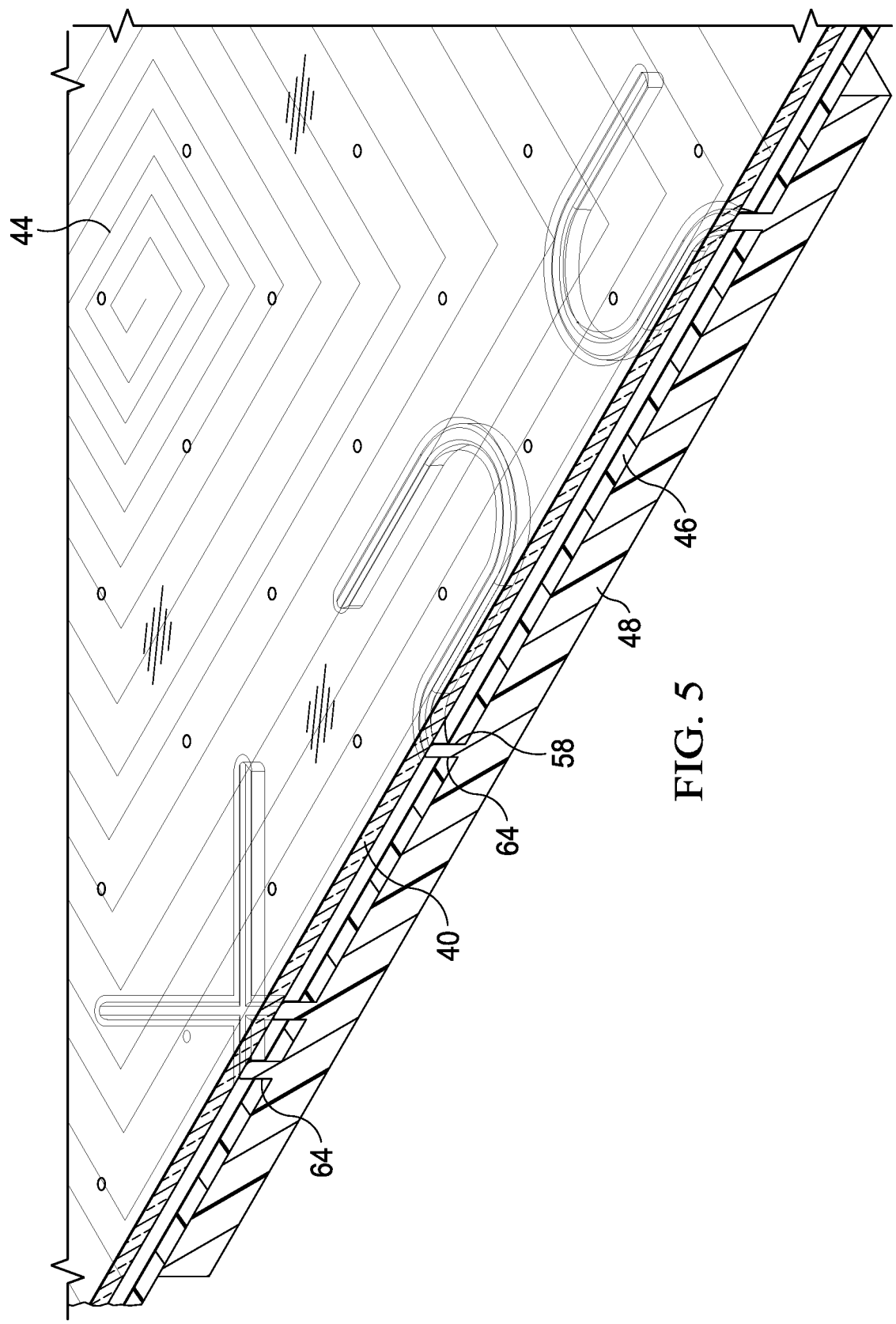
FIGS. 5, 5A, and 5B depict a sectional lower perspective view of an example of a plastic casing that couples to the interior side of the glass ceramic housing to accept the heat conductor logo against the heat sink.
Figure 5A:
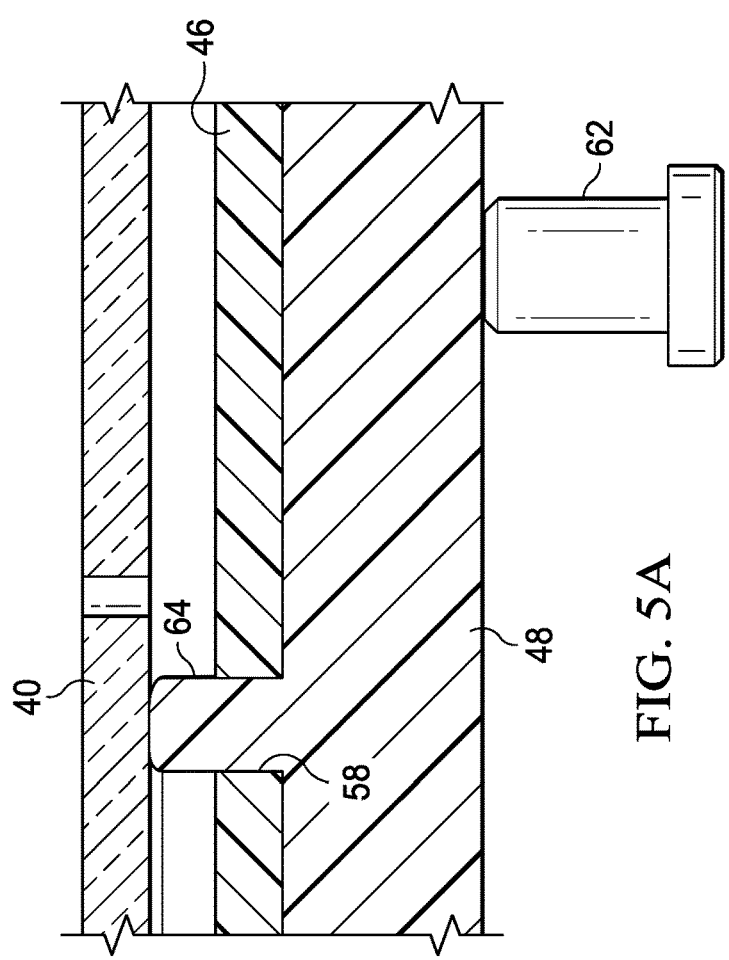
Figure 5B:
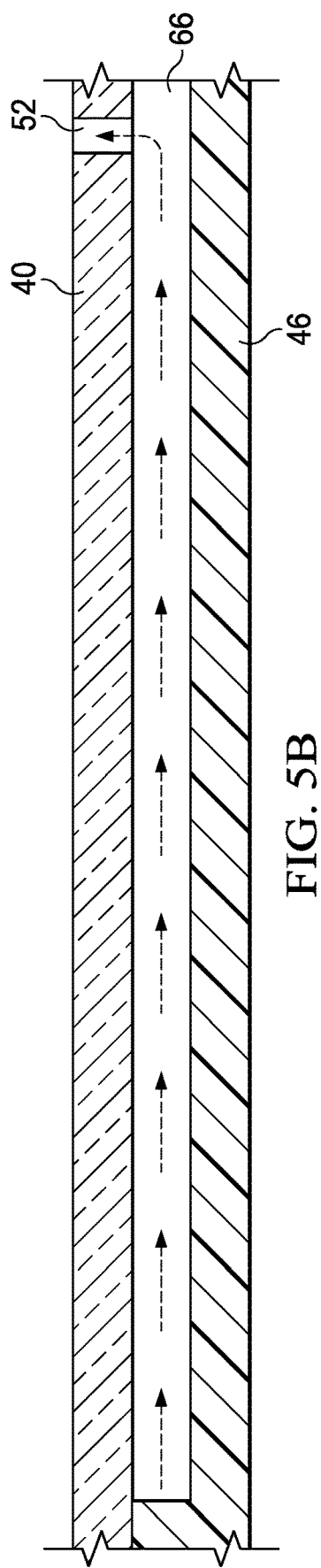

Referring now to FIGS. 5, 5A, and 5B, a sectional lower perspective view depicts an example of a plastic casing 46 that couples to the interior side of the glass ceramic housing 40 to accept the heat conductor 48 logo against the heat sink 44. Plastic cases 46 conforms to the shape of the interior of glass ceramic housing 40 and includes openings 58 that pass through logo letters 64 to contact the thermally conductive heat sink traces. In the example embodiment, letters 64 fit through openings 58 to be visibly shown at the exterior of glass ceramic housing 40. FIG. 5A depicts a side sectional view of letters 64 extending through opening 58 of plastic case 46 to rest against the bottom surface of glass ceramic housing 40 where heat sink 44 is exposed to accept thermal energy. Pogo pin 62 presses against heat conductor 48 to provide a consistent physical contact through which thermal energy transfers. FIG. 5B depicts a side sectional view of an air cavity 66 defined between ceramic glass housing 40 and plastic case 46 to support a cooling air flow that proceeds out through glass via opening 52.

Figure 6:
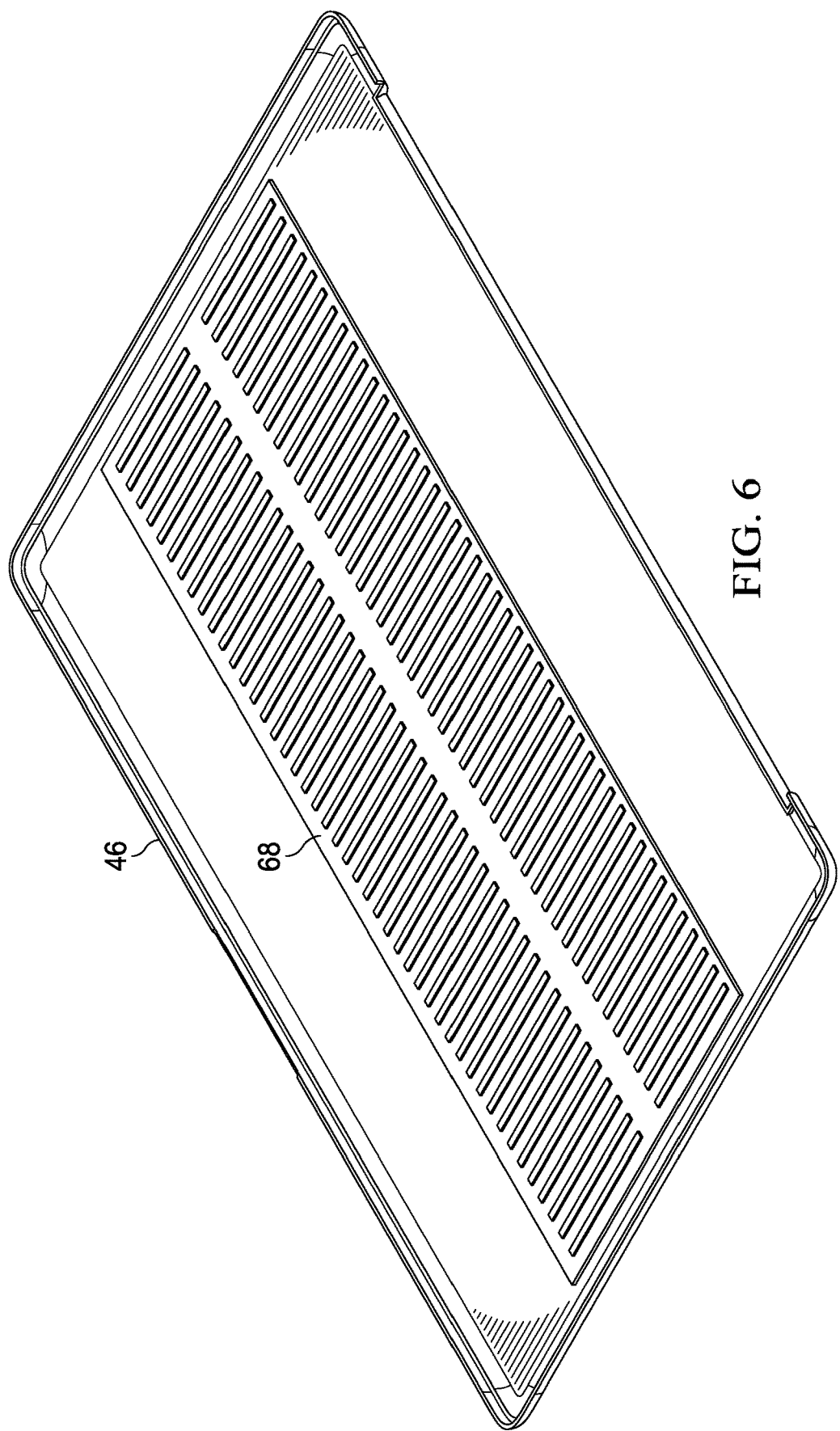
FIG. 6 depicts a lower perspective view of an example of an alternative embodiment for a heat sink that aids in dissipation of thermal energy from an information handling system interior.

Referring now to FIG. 6, a lower perspective view depicts an example of an alternative embodiment for a heat sink 68 that aids in dissipation of thermal energy from an information handling system interior. Heat sink 68 is, for example a copper or graphene coated material having high thermal conductivity to accept excess thermal energy from processing components disposed in the information handling system. Ridges or raised areas formed in heat sink 68 fit through plastic case 46 to promote transfer of thermal energy against the glass ceramic housing, such as where air channels and through glass via openings can help to dissipate the thermal energy external to the housing.

Figure 7:
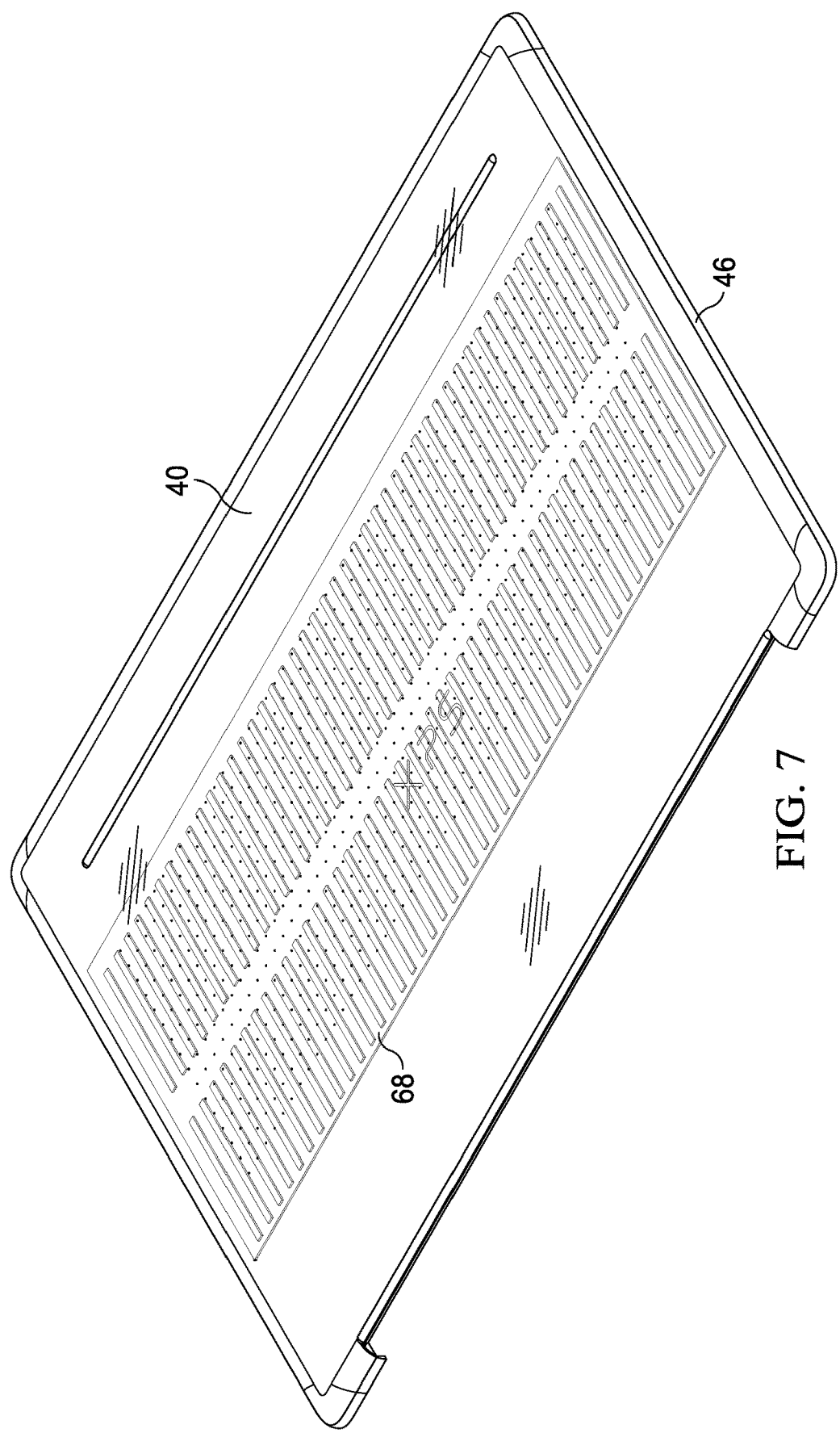
FIGS. 7 and 7A depict a lower perspective view and side sectional view of the alternative heat sink configured to transfer thermal energy from the housing interior to the housing exterior.
Figure 7A:
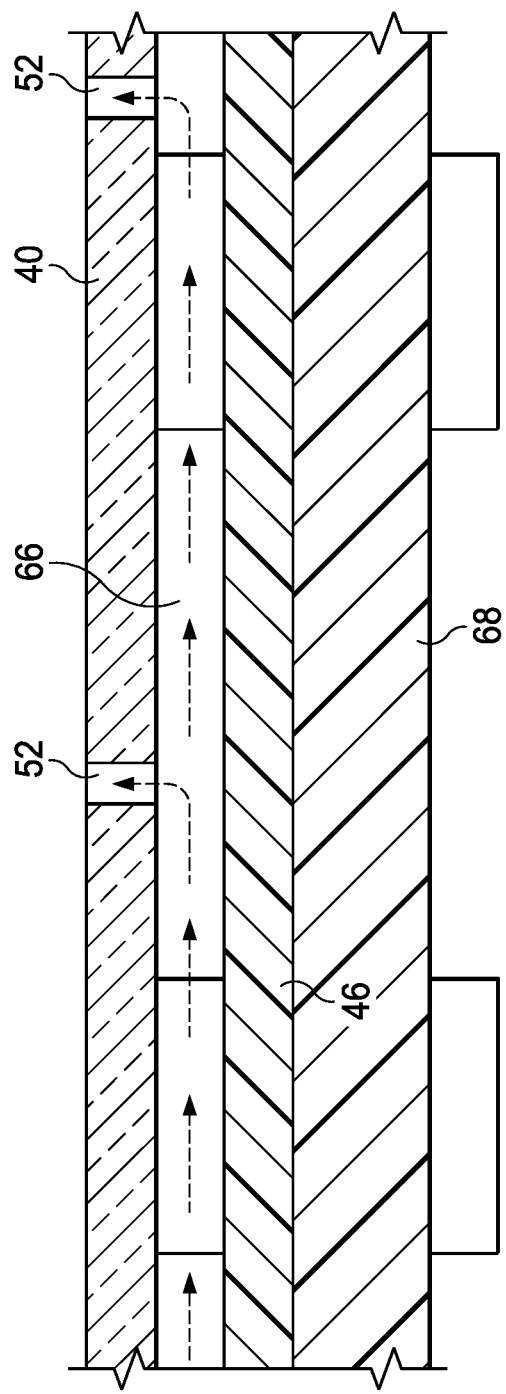

Referring now to FIGS. 7 and 7A, a lower perspective view and side sectional view depict the alternative heat sink configured to transfer thermal energy from the housing interior to the housing exterior. FIG. 7 depicts ridges of heat sink 68 that extend through plastic case 46 to press against glass ceramic housing 40 to dissipate thermal energy from within the housing to the housing exterior. Although the example embodiment does not include a heat sink integrated in glass ceramic housing 40, one may optionally be included at either or both of the interior and exterior sides of the housing. FIG. 7A depicts a sectional side view to illustrate a cooling channel 66 formed by plastic case 46 against glass ceramic housing 40 to promote an airflow across heat sink 68 and out through glass via openings 52 to help dissipate thermal energy. In the example embodiment, ridges in heat sink 68 extend through openings in plastic case 46 to press against glass ceramic housing 40. Cooling air channels 66 may be provided along the surface of integrated heat sinks, such as that disclosed in FIG. 5 by providing a cavity in the case to support a space for air flow.

Figure 8:
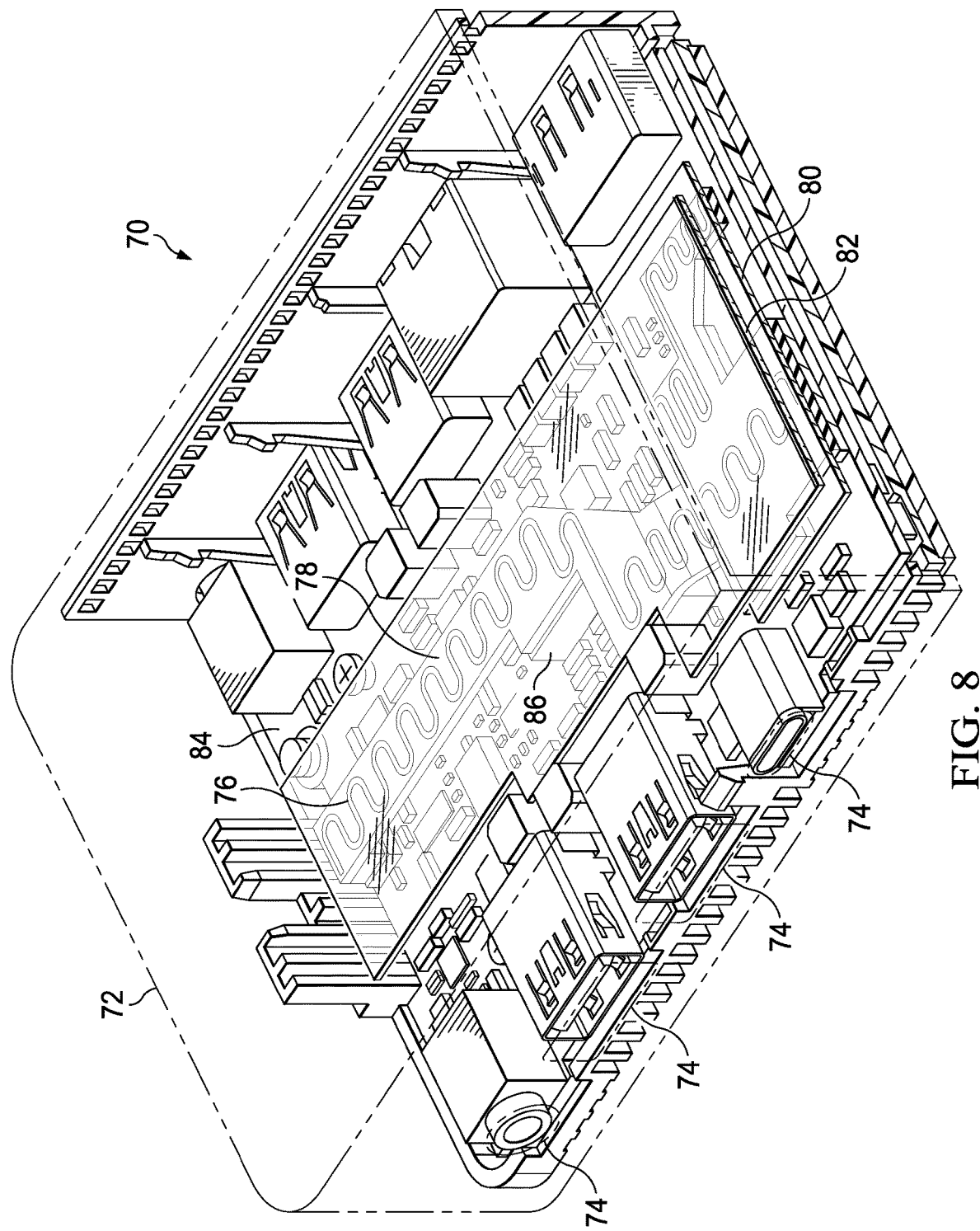
FIGS. 8 and 8A, an example embodiment depicts a glass heat sink that dissipates excess thermal energy in a docking station.
Figure 8A:
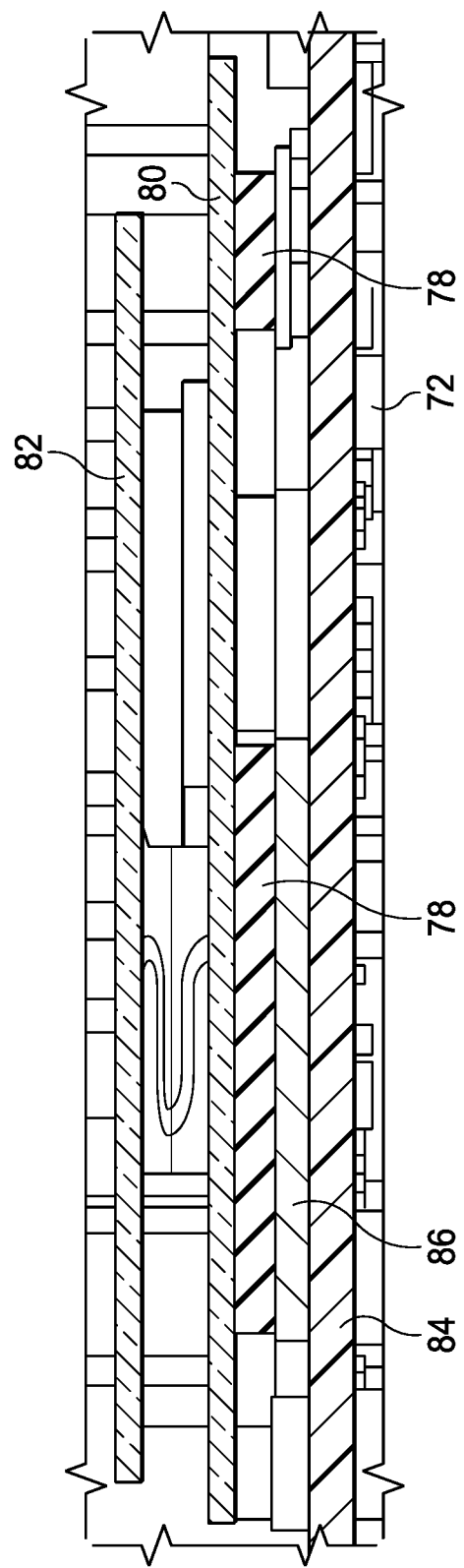

Referring now to FIGS. 8 and 8A, an example embodiment depicts a glass heat sink that dissipates excess thermal energy in a docking station 70. Docking station 70 provides support for operation of an information handling system, such as with plural ports 74 exposed at a housing 72 that accept cables to provide power, peripheral device interfaces, network interfaces and other support functions. A printed circuit board assembly (PCBA) 84 disposed in housing 72 supports operations of plural processing components 86 that provide support functions. For example, the processing components 86 may include a power supply to provide DC voltage at a power port, a USB hub to communicate data, and a graphics card to provide pixel values for different types of graphics communication protocols. The processing components generate thermal energy as a byproduct of operations and at different levels based upon the load placed on the processing components while supporting information handling system functions. Excessive thermal energy can result in component failure. One way to manage thermal conditions is to include a large heat sink in housing 72; however, heat sinks add to the weight and size docking station 70. To provide adequate thermal management within housing 72, a thin glass ceramic material coated with thermally conductive material is interfaced with the processing components to receive and dissipate thermal energy with minimal weight and footprint. Although the example glass heat sink described herein is used in a docking station, in alternative embodiments the glass heat sink may be used in a portable information handling system or other processing device.

Figure 9:
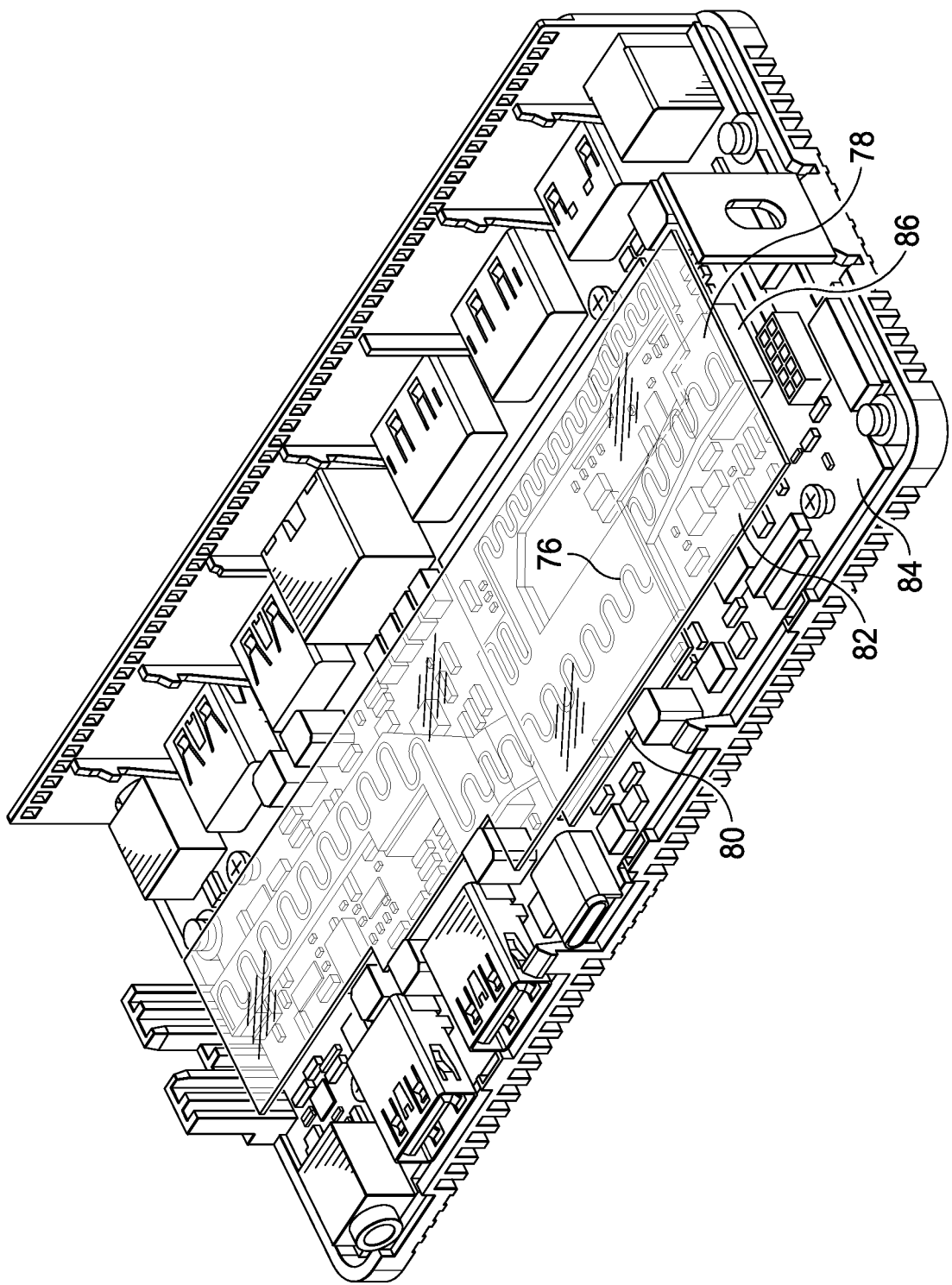
FIG. 9 depicts a side perspective view of the docking station with the housing removed.

In the example embodiment, plural vertically stacked pieces of glass ceramic material 82 coated with graphene are thermally interfaced by a thermal elastomer 78 of liquid metal embedded elastomer material that couples with an elastic graphene 76. FIG. 8A depicts a side sectional view of docking station 70 that illustrates an example of vertically stacked glass heat sinks. Housing 72 holds PCBA 84 with plural processing components 86 coupled to it and generating thermal energy as a byproduct of operations. A thermal elastomer 78 thermally couples each processing component with the glass ceramic material 82 to transfer thermal energy to the graphene 80 that coats the glass ceramic material. Elastic graphene 76 couples to thermal elastomer 78 and presses against the graphene coating of glass ceramic material 82 to aid in transfer of excess thermal energy. In one example embodiment, thermal elastomer 78 is a silicon base embedded with liquid phase eutectic gallium indium (EGIan) microdroplets. As an example, a product named "Thubber" is commercially available from Arieca with these materials and acceptable thermal properties. Elastic graphene is manufactured using lithographic filtration to have a wavy channel that adjusts to lateral forces that might translate through the thermal elastomer. An example of an elastic graphene may be found in this article: https://www.semanticscholar.org/paper/Stretchable-graphene-thermistor-with-tunable-index.-Yan-Wang/
1d03bb564b4713a2b69a42f31a0ae6f1d5cf2bff Referring now to FIG. 9, a side perspective view depicts the docking station 70 with the housing removed. Thermal elastomer 78 in the example embodiment routes between plural processing components that have different vertically stacked levels relative to PCBA 84. Elastic graphene 76 embeds with the thermal elastomer to also adjust vertically between the processing components. In the example embodiment, two vertically stacked glass ceramic material 82 pieces, each coated with graphene, interface with the thermal elastomer to accept thermal energy, as shown in the side sectional view of FIG. 8A. The low profile of the glass material adjust to the vertical stacking so that multiple layers of the heat sink assembly cater to components of different heights and allow more levels of material for heat dissipation within the small footprint of the docking station. Replacing a heavy metal heat sink with vertically-stacked graphene coated glass reduces both weight and Z-height of the docking station.

Figure 10A:
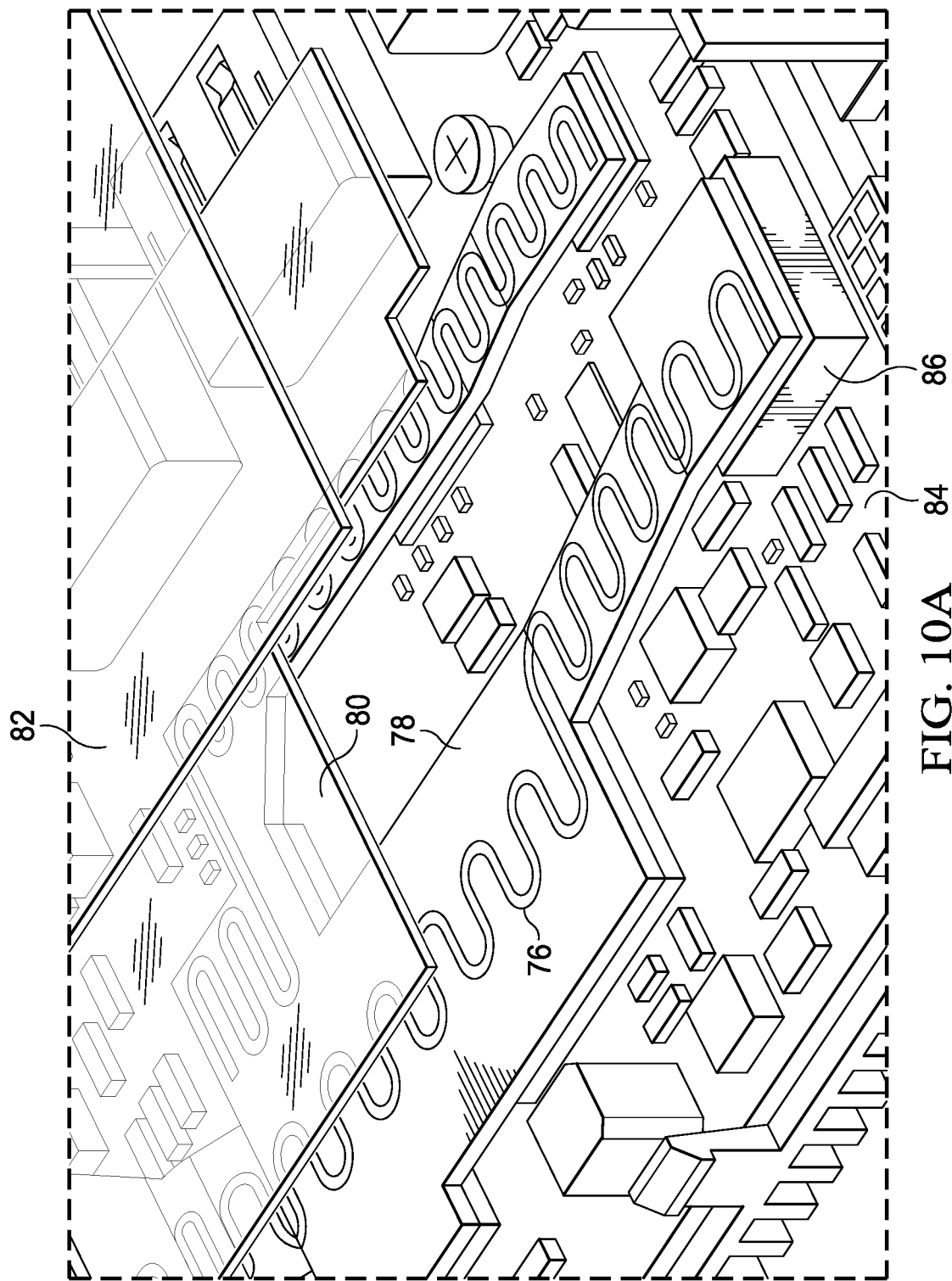

Referring now to FIGS. 10 and 10A, an exploded perspective view depicts the docking station 70 and heat sink.

The vertical stacking of processing components defines different sized areas at different vertical stacking heights in which a heat sink can fit. In the example embodiment, a lower glass ceramic material 82 fits in a middle portion of the docking station with a thermal elastomer 78 disposed underneath and having an elastic graphene 76 that presses against the graphene coating of the glass ceramic piece to encourage thermal transfer. An upper glass ceramic material 82 has a larger footprint that can fit within the docking station over top of the processing components. Thermal elastomer 78 interfaces the lower and upper glass ceramic material 82 to provide a thermal conduit for dissipation of thermal energy throughout the housing. Elastic graphene 76 is disposed at the upper and lower surfaces of thermal elastomer 78 to contact against the graphene coating and encourage thermal energy transfer.

Although the present invention has been described in detail, it should be understood that various changes, substitutions and alterations can be made hereto without departing from the spirit and scope of the invention as defined by the appended claims.

What is claimed is:

1. An information handling system comprising:
    a housing having a glass ceramic material;
    a processor disposed in the housing and operable to execute instructions to process information;
    a memory disposed in the housing and interfaced with the processor, the memory operable to store the instructions and information;
    an embedded controller disposed in the housing and interfaced with the processor, the embedded controller operable to manage power applied to the processor and memory and to manage thermal constraints associated with the housing;
    a thermally-conductive material integrated in the glass ceramic material; and
    a thermal transfer device thermally interfaced with the thermally-conductive material and the processor to communicate thermal energy from the processor to the housing.

2. The information handling system of claim 1 wherein the thermally-conductive material comprises:
    a dielectric sheet;
    a silver alloy wire coupled to the dielectric sheet; and
    an optically clear adhesive coupling the dielectric sheet to the glass ceramic material.

3. The information handling system of claim 2 wherein the silver alloy wire forms a coil shape.

4. The information handling system of claim 2 wherein the silver alloy wire forms a mesh shape.

5. The information handling system of claim 1 further comprising a plastic case coupled to an interior side of the glass ceramic and having an opening, the thermal transfer device having an extension passed through the opening to contact the thermally-conductive material.

6. The information handling system of claim 5 wherein the thermal transfer device extension comprises a product logo.

7. The information handling system of claim 5 wherein the thermal transfer device comprises plastic having a graphene coating.

8. The information handling system of claim 5 wherein the plastic case defines cooling channels to pass a cooling airflow between the plastic case and the glass ceramic material.

9. The information handling system of claim 5 wherein the glass ceramic material has plural through glass via openings to communicate the cooling airflow from the cooling channels to the glass ceramic exterior side.

10. A method for managing thermal energy at an information handling system, the method comprising:
    integrating a thermally conductive material physically into a material of a glass housing of the information handling system;
    thermally interfacing the thermally conductive material with a processor of the information handling system; and
    communicating thermal energy from the processor to the thermally conductive material.

11. The method of claim 10 further comprising:
    integrating the thermally conductive material in a transparent sheet; and
    coupling the transparent sheet to the glass housing with optically clear adhesive.

12. The method of claim 10 further comprising:
    integrating thermally conductive material in a product logo depiction;
    interfacing the product logo thermally-conductive material with the processor; and
    pressing the product logo against the glass housing to interface with the thermally conductive material of the glass housing, the product logo arranged to be visible from the glass housing exterior.

13. The method of claim 12 wherein the thermally-conductive material integrated in the glass housing comprises a silver alloy wire forming a coil.

14. The method of claim 12 wherein the thermally-conductive material integrated in the glass housing comprises a silver alloy wire forming a mesh.

15. The method of claim 10 further comprising:
    defining cooling air channels proximate the thermally conductive material at a glass housing interior; and
    forming through glass via openings through the glass housing to communicate cooling airflow between the cooling channels and the glass housing exterior.

16. The method of claim 15 further comprising:
    coupling a case to the glass housing interior, the case defining a cooling channel proximate the glass housing; and
    passing the air through the cooling channel and out the through glass via openings.

17. A glass housing comprising:
    a planar glass ceramic having an interior side and an exterior side;
    a case coupled to the interior side;
    thermally conductive material integrated into a physical material on one side of the planar glass ceramic; and
    a thermal transfer device configured to couple to a processing component at a first end and to press against the thermally conductive material at a second end to transfer thermal energy from the processing component to the thermally conductive material.

18. The glass housing of claim 17 wherein the thermally conductive material integrates at the interior side and the thermal transfer device contacts the thermally conductive material through an opening in the case.

19. The glass housing of claim 17 wherein the thermally conductive material integrates at the exterior side and the thermal transfer device comprises a logo that presses against the planar glass.

20. The glass housing of claim 19 wherein the logo comprises plastic coated in graphene.

* * * * *